（12）United States Patent
Houle et al.

(10) Patent No.: US 8,987,894 B2
(45) Date of Patent: *Mar. 24, 2015

(54) UNDERFILL PROCESS AND MATERIALS FOR SINGULATED HEAT SPREADER STIFFENER FOR THIN CORE PANEL PROCESSING

(71) Applicant: Intel Corporation, Santa Clara, CA (US)

(72) Inventors: Sabina J. Houle, Phoenix, AZ (US); James P Mellody, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/320,210

(22) Filed: Jun. 30, 2014

(65) Prior Publication Data

US 2014/0312487 A1 Oct. 23, 2014

Related U.S. Application Data

(62) Division of application No. 13/784,528, filed on Mar. 4, 2013, now Pat. No. 8,765,528, which is a division of application No. 12/242,060, filed on Sep. 30, 2008, now Pat. No. 8,390,112.

(51) Int. Cl.
| | |
|---|---|
| H01L 23/34 | (2006.01) |
| H01L 23/28 | (2006.01) |
| H01L 23/42 | (2006.01) |
| H01L 21/50 | (2006.01) |
| H01L 23/00 | (2006.01) |
| H01L 23/373 | (2006.01) |

(52) U.S. Cl.
CPC .............. *H01L 23/28* (2013.01); *H01L 23/42* (2013.01); *H01L 21/50* (2013.01); *H01L 23/34* (2013.01); *H01L 24/97* (2013.01); *H01L 23/3736* (2013.01); *H01L 2224/16225* (2013.01); *H01L 2224/73253* (2013.01); *H01L 2224/97* (2013.01)
USPC ............ 257/713; 257/787; 438/122; 438/127

(58) Field of Classification Search
None
See application file for complete search history.

(56) References Cited

U.S. PATENT DOCUMENTS

| | | |
|---|---|---|
| 5,940,271 A | 8/1999 | Mertol |
| 5,990,418 A | 11/1999 | Bivona et al. |
| 6,097,101 A | 8/2000 | Sato et al. |

(Continued)

OTHER PUBLICATIONS

"U.S. Appl. No. 12/242,060 , Response filed Jul. 3, 2012 to Non Finaal Office Action mailed Mar. 30, 2012", 8 pgs.
"U.S. Appl. No. 12/242,060, Advisory Action mailed Sep. 26, 2012", 3 pgs.
"U.S. Appl. No. 12/242,060, Final Office Action mailed Jul. 18, 2012", 17 pgs.

(Continued)

*Primary Examiner* — Andres Munoz
(74) *Attorney, Agent, or Firm* — Schwegman Lundberg & Woessner, P.A.

(57) ABSTRACT

A method of making a microelectronic package, and a microelectronic package made according to the method. The method includes: bonding and thermally coupling a plurality of IC dies to an IHS panel to yield a die-carrying IHS panel, and mounting the die-carrying IHS panel onto a substrate panel including a plurality of package substrates by mounting perimeter ribs of the IHS panel to a corresponding pattern of sealant on the substrate panel and by mounting each of the plurality of dies to a corresponding one of the plurality of package substrates to yield a combination including the die-carrying IHS panel mounted to the substrate panel. Other embodiments are also disclosed and claimed.

17 Claims, 3 Drawing Sheets

(56) References Cited

U.S. PATENT DOCUMENTS

| | | |
|---|---|---|
| 6,191,360 B1 | 2/2001 | Tao et al. |
| 6,246,115 B1 | 6/2001 | Tang et al. |
| 6,707,168 B1 | 3/2004 | Hoffman et al. |
| 6,957,692 B1 | 10/2005 | Win-Haw et al. |
| 7,045,890 B2 | 5/2006 | Xie et al. |
| 7,203,072 B2 * | 4/2007 | Chen et al. .............. 361/760 |
| 8,067,256 B2 | 11/2011 | Houle et al. |
| 8,089,146 B2 | 1/2012 | Fukuzono |
| 8,390,112 B2 | 3/2013 | Houle et al. |
| 8,765,528 B2 | 7/2014 | Houle et al. |
| 2004/0262766 A1 | 12/2004 | Houle |
| 2004/0266065 A1 | 12/2004 | Zhang et al. |
| 2005/0046015 A1 * | 3/2005 | Shim et al. .............. 257/713 |
| 2005/0224953 A1 | 10/2005 | Lee et al. |
| 2006/0125088 A1 | 6/2006 | Huang et al. |
| 2006/0166397 A1 | 7/2006 | Lau et al. |
| 2007/0045819 A1 | 3/2007 | Edwards et al. |
| 2007/0117270 A1 | 5/2007 | Renavikar et al. |
| 2010/0079957 A1 | 4/2010 | Houle et al. |
| 2013/0168846 A1 | 7/2013 | Houle et al. |

OTHER PUBLICATIONS

"U.S. Appl. No. 12/242,060, Non Final Office Action mailed Jun. 15, 2011", 18 pgs.

"U.S. Appl. No. 12/242,060, Notice of Allowance mailed Nov. 2, 2012", 8 pgs.

"U.S. Appl. No. 12/242,060, Response filed Sep. 18, 2012 to Final Office Action mailed Jul. 18, 2012", 9 pgs.

"U.S. Appl. No. 13/784,528, Ex Parte Quayle Action mailed Nov. 7, 2013", 8 pgs.

"U.S. Appl. No. 13/784,528, Non Final Office Action mailed Jul. 26, 2013", 14 pgs.

"U.S. Appl. No. 13/784,528, Notice of Allowance mailed Feb. 20, 2014", 9 pgs.

"U.S. Appl. No. 13/784,528, Response filed Feb. 7, 2014 to Ex Parte Quayle Action mailed Nov. 7, 2013", 5 pgs.

"U.S. Appl. No. 13/784,528, Response filed Jul. 8, 2013 to Restriction Requirement mailed Jun. 7, 2013", 4 pgs.

"U.S. Appl. No. 13/784,528, Response filed Oct. 28, 2013 to Non Final Office Action mailed Jul. 26, 2013", 6 pgs.

"U.S. Appl. No. 13/784,528, Restriction Requirement mailed Jun. 7, 2013", 7 pgs.

* cited by examiner

UNDERFILL PROCESS AND MATERIALS FOR SINGULATED HEAT SPREADER STIFFENER FOR THIN CORE PANEL PROCESSING

PRIORITY APPLICATION

This application is a divisional of U.S. application Ser. No. 13/784,528, filed Mar. 4, 2013, which is a divisional of U.S. application Ser. No. 12/242,060, filed Sep. 30, 2008, now issued as U.S. Pat. No. 8,390,112, both of which are incorporated herein by reference in their entirety.

FIELD

The present invention relates to methods of fabricating microelectronic packages, and especially to an underfill process and materials for singulated heat spreader stiffener for thin core panel processing.

BACKGROUND

As microelectronic components shrink in size, a trend has emerged to provide package substrates that may be characterized as thin core substrates (that is, substrates having a core with a thickness less than or equal to 400 microns and larger than zero), or no-core substrates (that is, substrates without cores). Disadvantageously, with a thin or no-core substrate, however, errors may occur during the package manufacturing process, such as, for example, during flip chip bonding where substrate flatness and rigidity are required. To address the above issue, the prior art sometimes provides substrates that may have a thickness of at least several tens of microns or more. However, the above measure disadvantageously detracts from further package size minimization.

The prior art fails to provide method or structures that address the above disadvantages.

Figure 1:
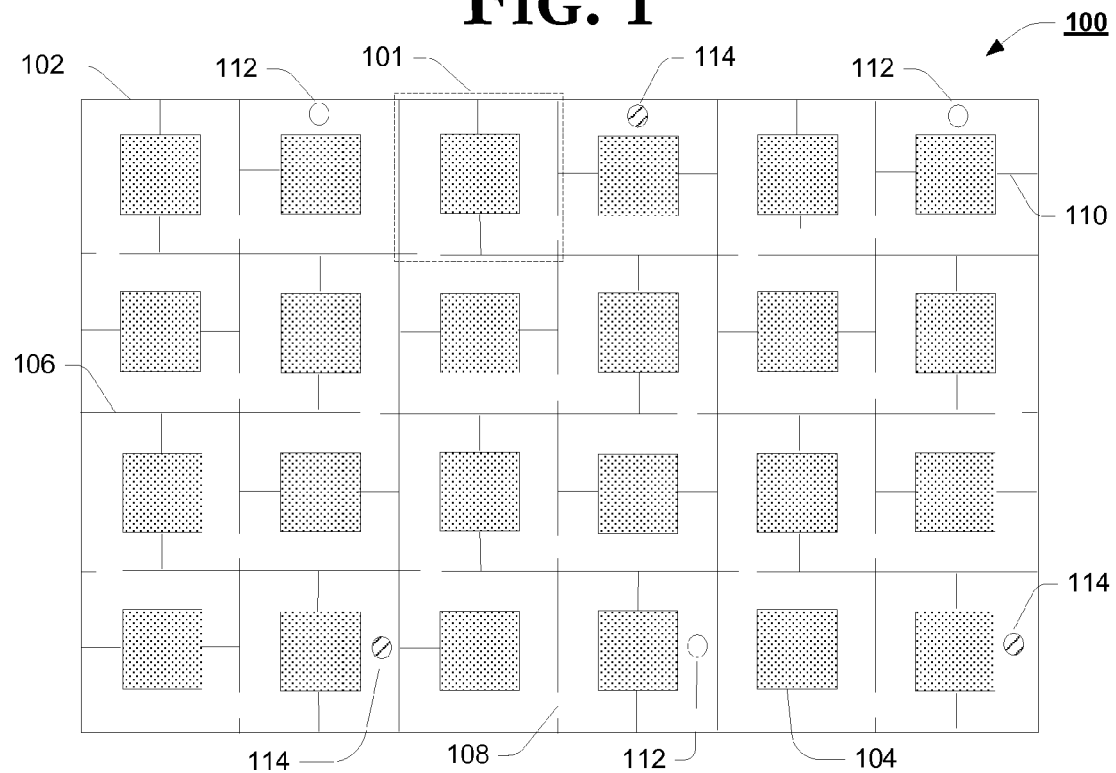
FIG. 1 is a graphical illustration of a bottom of an example integrated heat spreader ("IHS") panel, in accordance with one example embodiment of the invention.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method of making a microelectronic package, and a microelectronic package made according to the method are disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

Referring first to FIG. 1, an example integrated heat spreader ("IHS") panel 100 includes IHS components 101, panel perimeter ribs 102, die sites 104, component perimeter ribs 106, component perimeter rib gaps 108, die site gates 110, openings 112, and porous plugs 114, as shown in FIG. 1. According to embodiments, IHS panel 100 may include stamped or cast copper, or may include any other material adapted to be used as a heat spreader including the protrusions described hereinafter, as would be within the knowledge of a skilled person. In one embodiment, IHS panel 100 is formed from injection molded magnesium. Integrated circuit dies may be bonded and thermally coupled to die sites 104 of a corresponding one of the IHS components 101 of IHS panel 100 to yield a die-carrying IHS panel. The dies may for example be bonded (that is, mechanically fixed to) and thermally coupled (that is, coupled for enhanced thermal conductivity) to die sites 104 of the respective ones of the IHS components 101 using a thermal interface material (TIM), as would be within the knowledge of the skilled person. While shown as including 24 IHS components 101, IHS panel 100 may include any number of IHS components 101.

Figure 2:
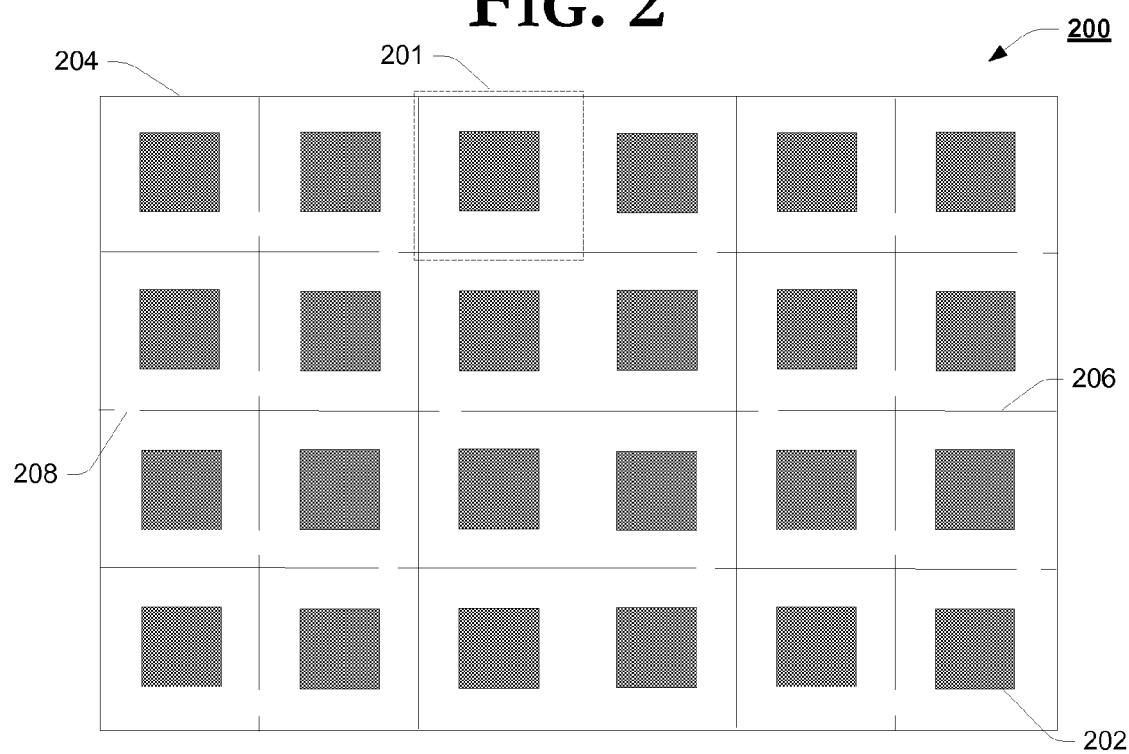
FIG. 2 is a graphical illustration of a top of an example substrate panel, in accordance with one example embodiment of the invention.

IHS panel 100 includes protrusions that extend perpendicularly from a bottom surface of IHS components 101. Panel perimeter ribs 102 protrude perpendicularly from a perimeter of IHS panel 100 and are able to couple and form an air-tight seal with a corresponding substrate panel, for example as shown in FIG. 2. Component perimeter ribs 106 protrude perpendicularly from and define the borders between IHS components 101. Component perimeter rib gaps 108 allow for the flow of underfill material between the spaces formed between IHS components 101 and the corresponding substrate. Die site gates 110 also protrude perpendicularly from IHS components 101 and are situated near die sites 104 so as to channel underfill material under a die as part of a method of manufacturing an integrated circuit device package, for example as described in reference to FIG. 4. The protrusions from IHS panel 100, namely panel perimeter ribs 102, component perimeter ribs 106 and die site gates 110, comprise a height generally coextensive with a height of an IC die bonded with each of IHS components 101.

IHS panel 100 of the shown embodiments defines a plurality of openings 112 extending through a thickness thereof, that is, extending from a die-carrying surface of IHS panel 100 all the way to an opposite, backside surface of IHS panel 100. Openings 112 may be utilized to inject underfill material into a space between IHS panel 100 and a corresponding substrate panel as described hereinafter. IHS panel 100 also defines a plurality of porous plugs 114. Porous plugs 114 comprise any suitable material through which air can, but underfill material can not, pass. While shown as including a same number of openings 112 as porous plugs 114, IHS panel 100 may include any number of openings 112 and porous plugs 114. In one embodiment, the plurality of openings 112 in IHS panel 100 is greater than the plurality of porous plugs 114.

Referring next to FIG. 2, an example substrate panel 200 includes substrate components 201, die interconnects 202, perimeter sealant pattern 204, component sealant pattern 206 and sealant gaps 208, as shown in FIG. 2. According to embodiments, substrate panel 200 may include any type of package substrate within the knowledge of a skilled person, such as, for example, one of a BGA substrate, a LGA substrate and a PGA substrate. According to one embodiment, substrate panel 200 includes at least one of thin substrates and no-core substrates. Substrate panel 200 contains a plurality of substrate components 201 each for bonding with an active surface of an IC die and an IHS component 101. Die interconnects 202 may be any interconnect within the knowledge of a skilled person, such as for example an array of solder balls. A top surface of substrate panel 200 include patterns of sealant for bonding with corresponding protrusions of IHS panel 100. For example, perimeter sealant pattern 204 is disposed around the perimeter of substrate panel 200 for bonding with panel perimeter ribs 102. Component sealant pattern 206 defines boundaries between substrate components 201 and bonds with component perimeter ribs 106. Sealant gaps 208 correspond with component perimeter rib gaps 108.

Figure 3:
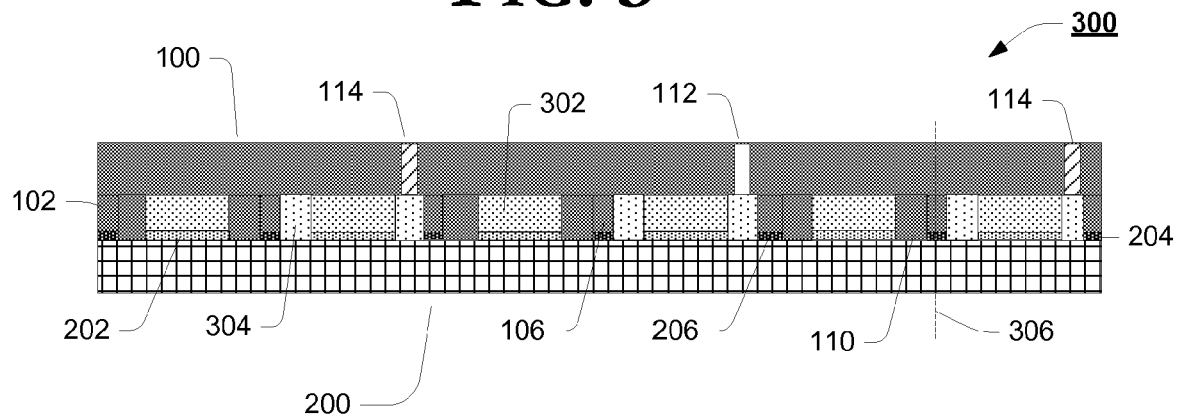
FIG. 3 is a graphical illustration of a cross-sectional view of an example assembly, in accordance with one example embodiment of the invention.

Referring next to FIG. 3, an example assembly 300 includes IHS panel 100, panel perimeter ribs 102, component perimeter ribs 106, die site gates 110, opening 112, porous plugs 114, substrate panel 200, die interconnects 202, perimeter sealant pattern 204, component sealant pattern 206, IC dies 302, underfill 304 and cut-line 306, as shown in FIG. 3. IC dies 302 may be bonded with IHS panel 100 before panel perimeter ribs 102 and component perimeter ribs 106 of IHS panel 100 are bonded with perimeter sealant pattern 204 and component sealant pattern 206 of substrate panel 200, respectively. The IC dies 302 of die-carrying IHS panel 100 may, according to an embodiment, be flip chip mounted onto die interconnects 202 of substrate panel 200 using a solder reflow process in a well known manner. Underfill 304 may be injected through opening 112 into spaces between IHS panel 100 and substrate panel 200 and forced around die site gates 110 into die interconnects 202 through vacuum suction applied through porous plugs 114. Underfill 304 may comprise any type of underfill polymers including, but not limited to, epoxy, silicone, TPO, PE/PP copolymers, urethane polymers including resin transfer molding (low pressure) and injection transfer molding (high pressure). Cut-line 306 represents where assembly 300 may be cut to singulate a microelectronic package including a package substrate component 201, an IC die 302, and an IHS component 101 being coextensive in its width and its length with respect to the package substrate.

Figure 4:
FIG. 4 is a flowchart of an example method for manufacturing a microelectronic device package, in accordance with one example embodiment of the invention.

Referring now to FIG. 4, an example method 400 for manufacturing a microelectronic device package begins with bonding (402) a plurality of IC dies 302 to IHS panel 100 to yield a die-carrying IHS panel. In one embodiment, the IC dies 302 are bonded to IHS panel 100 using a thermal interface material. At some point a sealant is dispensed (404) in patterns on a top surface of substrate panel 200. Next, perimeter ribs (for example 102 and 106) of IHS panel 100 are mounted (406) to corresponding sealant patterns (for example 204 and 206) on substrate panel 200 to yield a combination including the die-carrying IHS panel mounted to the substrate panel. IC dies 302 are bonded (408) and solder reflowed with die interconnects 202 of substrate panel 200. Air is evacuated from and underfill is injected into (410) the spaces between IHS panel 100 and substrate panel 200. In one embodiment, a vacuum is created by applying suction to porous plugs 114 thereby evacuating air, but blocking the escape of underfill material. In one embodiment, underfill is forcibly injected through openings 112. Provision of the underfill material may involve curing the same, as would be recognized by the skilled person. Lastly, IC packages are singulated (412) from the assembly 300 for example by a saw cutting along cut-line 306.

Figure 5:
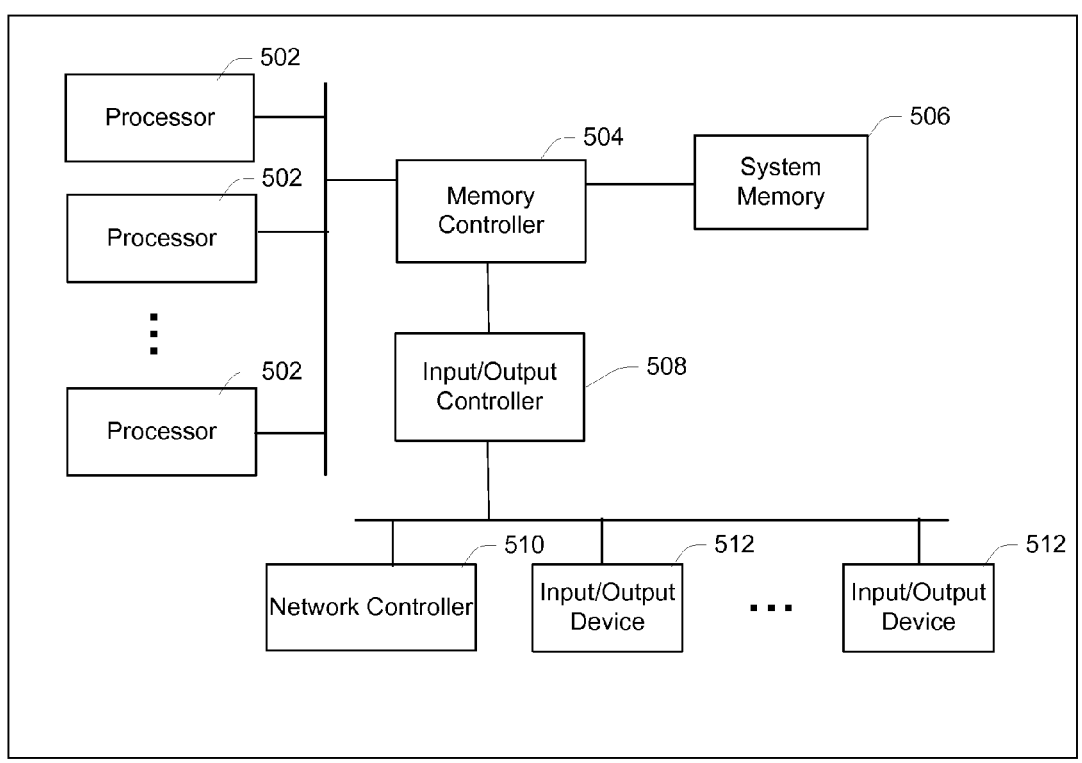
FIG. 5 is a block diagram of an example electronic appliance suitable for implementing a microelectronic device package including an IHS described herein, in accordance with one example embodiment of the invention.

FIG. 5 is a block diagram of an example electronic appliance suitable for implementing a microelectronic device package including an IHS described herein, in accordance with one example embodiment of the invention. Electronic appliance 500 is intended to represent any of a wide variety of traditional and non-traditional electronic appliances, laptops, desktops, cell phones, wireless communication subscriber units, wireless communication telephony infrastructure elements, personal digital assistants, set-top boxes, or any electric appliance that would benefit from the teachings of the present invention. In accordance with the illustrated example embodiment, electronic appliance 500 may include one or more of processor(s) 502, memory controller 504, system memory 506, input/output controller 508, network controller 510, and input/output device(s) 512 coupled as shown in FIG. 5. Processor(s) 502, or other integrated circuit components of electronic appliance 500, may comprise a microelectronic device package including an IHS as described previously as an embodiment of the present invention.

Processor(s) 502 may represent any of a wide variety of control logic including, but not limited to one or more of a microprocessor, a programmable logic device (PLD), programmable logic array (PLA), application specific integrated circuit (ASIC), a microcontroller, and the like, although the present invention is not limited in this respect. In one embodiment, processors(s) 502 are Intel® compatible processors. Processor(s) 502 may have an instruction set containing a plurality of machine level instructions that may be invoked, for example by an application or operating system.

Memory controller 504 may represent any type of chipset or control logic that interfaces system memory 506 with the other components of electronic appliance 500. In one embodiment, the connection between processor(s) 502 and memory controller 504 may be a point-to-point serial link. In another embodiment, memory controller 504 may be referred to as a north bridge.

System memory 506 may represent any type of memory device(s) used to store data and instructions that may have been or will be used by processor(s) 502. Typically, though the invention is not limited in this respect, system memory 506 will consist of dynamic random access memory (DRAM). In one embodiment, system memory 506 may consist of Rambus DRAM (RDRAM). In another embodiment, system memory 506 may consist of double data rate synchronous DRAM (DDRSDRAM).

Input/output (I/O) controller 508 may represent any type of chipset or control logic that interfaces I/O device(s) 512 with the other components of electronic appliance 500. In one embodiment, I/O controller 508 may be referred to as a south bridge. In another embodiment, I/O controller 508 may comply with the Peripheral Component Interconnect (PCI) Express™ Base Specification, Revision 1.0a, PCI Special Interest Group, released Apr. 15, 2003.

Network controller 510 may represent any type of device that allows electronic appliance 500 to communicate with other electronic appliances or devices. In one embodiment, network controller 510 may comply with a The Institute of Electrical and Electronics Engineers, Inc. (IEEE) 802.11b standard (approved Sep. 16, 1999, supplement to ANSI/IEEE Std 802.11, 1999 Edition). In another embodiment, network controller 510 may be an Ethernet network interface card.

Input/output (I/O) device(s) 512 may represent any type of device, peripheral or component that provides input to or processes output from electronic appliance 500.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. An apparatus comprising: an IHS (integrated heat spreader) panel including a plurality of IHS components each containing a site to receive and bond with an IC (integrated circuit) die, wherein the IHS panel includes perimeter ribs that protrude perpendicularly from the plurality of IHS components, wherein the IHS panel includes a porous plug, and wherein the IHS panel includes an opening extending through a thickness of the IHS panel, wherein the IHS panel further comprises one or more gates which protrude from the perimeter ribs near IC die sites wherein the one or more gates are configured to channel flow of an underfill material beneath the IC die and around solder connections.

2. The apparatus of claim 1, wherein the opening and porous plug further comprise a plurality of openings and porous plugs.

3. The apparatus of claim 2, wherein the plurality of openings is greater than the plurality of porous plugs.

4. The apparatus of claim 1, further comprising a plurality of IC dies bonded to a number of sites on the plurality of IHS components.

5. The apparatus of claim 4, further comprising a substrate panel including a plurality of package substrates coupled with the perimeter ribs of the IHS panel and each of the plurality of IC dies.

6. A microelectronic package comprising:
an integrated circuit (IC) die mounted to a package substrate; and
an integrated heat spreader (IHS) thermally coupled to the IC die;
wherein the IHS includes a perimeter rib that extends from a bottom surface of the IHS perpendicularly toward and bonds with a top surface of the package substrate, wherein the perimeter rib includes at least one underfill region surrounding the IC die between the IHS and the package substrate; and
a gate that extends inward from the perimeter rib to a location adjacent to the IC die, and wherein the gate physically contacts the package substrate and the IHS substantially continuously between the perimeter rib and the IC die.

7. The microelectronic package of claim 6, wherein the IHS comprises injected molded magnesium.

8. The microelectronic package of claim 6, wherein the IHS comprises copper.

9. The microelectronic package of claim 6, wherein the package substrate includes a coreless package substrate.

10. A microelectronic package comprising:
an integrated circuit (IC) die mounted to a package substrate; and
an integrated heat spreader (IHS) thermally coupled to the IC die;
wherein the IHS includes a perimeter rib that extends from a bottom surface of the IHS perpendicularly toward and bonds with a top surface of the package substrate, wherein the perimeter rib includes at least one underfill region surrounding the IC die between the IHS and the package substrate;
a gate that extends inward from the perimeter rib to a location adjacent to the IC die, and wherein the gate physically contacts the package substrate and the IHS substantially continuously between the perimeter rib and the IC die; and
a perimeter gap in the perimeter rib.

11. The microelectronic package of claim 10, wherein the IHS comprises copper.

12. The microelectronic package of claim 10, wherein the IHS comprises injected molded magnesium.

13. The microelectronic package of claim 10, wherein the package substrate includes a coreless package substrate.

14. An apparatus comprising:
a number of integrated circuit (IC) dies mounted to a substrate panel; and
an integrated heat spreader (IHS) panel thermally coupled to the number of integrated circuit (IC) dies;
wherein the IHS panel includes perimeter ribs that extend from a bottom surface of the IHS panel perpendicularly toward a top surface of the substrate panel, and bond with a top surface of the substrate panel, wherein the perimeter ribs include at least one underfill region surrounding the number of integrated circuit (IC) dies between the IHS panel and the substrate panel;
a perimeter gap in the perimeter ribs to allow flow of underfill material between adjacent IC dies; and
one or more gates which protrude from the perimeter ribs near each of the number IC dies wherein the one or more gates are configured to channel flow of an underfill material beneath each IC die of the number of IC dies and around solder connections.

15. The apparatus of claim 14, further including at least one porous plug in the IHS panel.

16. The apparatus of claim 15, further including at least one opening extending through a thickness of the IHS panel.

17. The apparatus of claim 16, wherein a number of openings is greater than a number of porous plugs.

* * * * *

UNITED STATES PATENT AND TRADEMARK OFFICE
CERTIFICATE OF CORRECTION

| | | |
|---|---|---|
| PATENT NO. | : 8,987,894 B2 | Page 1 of 1 |
| APPLICATION NO. | : 14/320210 | |
| DATED | : March 24, 2015 | |
| INVENTOR(S) | : Houle et al. | |

It is certified that error appears in the above-identified patent and that said Letters Patent is hereby corrected as shown below:

On the title page, in column 2, line 2, under "Other Publications", delete "Finaal" and insert --Final--, therefor

IN THE CLAIMS

In column 6, line 52, in Claim 14, after "number", insert --of--, therefor

Signed and Sealed this
First Day of March, 2016

Michelle K. Lee
*Director of the United States Patent and Trademark Office*